United States Patent
Sreenivasan

(10) Patent No.: US 10,524,370 B2
(45) Date of Patent: Dec. 31, 2019

(54) ELECTROSTATIC CHARGE BUILD-UP PREVENTION FOR DATA STORAGE DEVICES

(71) Applicant: Seagate Technology LLC, Cupertino, CA (US)

(72) Inventor: Sathish Narayanan Sreenivasan, Tamil Nadu (IN)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 357 days.

(21) Appl. No.: 15/635,670

(22) Filed: Jun. 28, 2017

(65) Prior Publication Data
US 2019/0008060 A1  Jan. 3, 2019

(51) Int. Cl.
| H02H 9/00 | (2006.01) |
| H05K 5/02 | (2006.01) |
| H05K 5/00 | (2006.01) |
| H05K 1/02 | (2006.01) |
| H05K 5/03 | (2006.01) |
| H05K 3/10 | (2006.01) |
| H02H 9/04 | (2006.01) |
| G11C 5/00 | (2006.01) |
| H05K 1/18 | (2006.01) |

(52) U.S. Cl.
CPC .......... *H05K 5/0247* (2013.01); *G11C 5/005* (2013.01); *H02H 9/045* (2013.01); *H05K 1/0237* (2013.01); *H05K 1/0259* (2013.01); *H05K 3/10* (2013.01); *H05K 5/0008* (2013.01); *H05K 5/0017* (2013.01); *H05K 5/0052* (2013.01); *H05K 5/03* (2013.01); *H05K 1/0243* (2013.01); *H05K 1/181* (2013.01); *H05K 2201/10159* (2013.01); *H05K 2201/10174* (2013.01)

(58) Field of Classification Search
None
See application file for complete search history.

(56) References Cited

U.S. PATENT DOCUMENTS

| 5,608,611 A * | 3/1997 | Szudarek ............ B60R 16/0239 |
| | | 174/138 G |
| 6,002,569 A | 12/1999 | Horvath |
| 6,650,519 B1 | 11/2003 | Karr et al. |
| 6,894,879 B2 | 5/2005 | Schadewald, Jr. et al. |
| 7,711,401 B2 | 5/2010 | Lim |
| 7,868,620 B2 | 1/2011 | Moe et al. |

(Continued)

OTHER PUBLICATIONS

Flashback data®; "Solid State Drives and Data Recovery" (in Data Recovery); Flashback Data, LLC.; Copyright © 2004-2017; 5 pages; https://www.flashbackdata.com/solid-state-drives-and-data-recovery/.

(Continued)

*Primary Examiner* — Stephen W Jackson
(74) *Attorney, Agent, or Firm* — Westman, Champlin & Koehler, P.A.

(57) ABSTRACT

A data storage drive includes a memory and a controller communicatively coupled to the memory. A casing encloses the controller and the memory. At least one electrically conductive grounding pad is included on an exterior of the casing. The electrically conductive grounding pad forms a portion of a low impedance path that extends from the grounding pad to a system ground in an interior of the data storage drive. The low impedance path prevents a build-up of static electricity.

20 Claims, 11 Drawing Sheets

(56) References Cited

U.S. PATENT DOCUMENTS

| | | |
|---|---|---|
| 7,911,759 B2 | 3/2011 | Williams et al. |
| 8,059,426 B2 | 11/2011 | Chen |
| 8,101,859 B2 | 1/2012 | Zadesky |
| 9,082,460 B2 | 7/2015 | Caldwell et al. |
| 9,153,858 B2 | 10/2015 | Gebert |
| 9,379,073 B2 | 6/2016 | Chen |

OTHER PUBLICATIONS

Ssd Stackup Picture to Pin on Pinterest—PinsDaddy; available before Jun. 28, 2017; http://www.pinsdaddy.com/ssd-stackup_0vYvY6vk2F3dglGfgxQKgWsPt1dkzwhPeyQ10PlxSZU/sT3W2DW%7C2s6vQnzAoVoGH0o%7CL8CONcC2vUDuyancVFpowcgvsdEwzivdip42aCzBX8yfkQC*pxs69OJaNUH8B%7Cdoao4JE%7CC9mJEdp3dzcfj7quN8ilBeeWgZBqZKbbxM/.

"Spring Contact—Multi-directional"; HarwinInterconnect; published on Jul. 8, 2014; 11 pages; https://www.youtube.com/watch?v=I4EGObpXz68.

MILL-MAX®; "Rugged Large Scale Spring-Loaded (Pogo) Pin Contacts"; © 2018 Mill-Max Mfg. Corp.; 2 pages; https://www.mill-max.com/new_products/detail/118.

TE connectivity; "Spring Finger Contacts"; © 2018 TE Connectivity; 6 pages; http://www.te.com/usa-en/products/connectors/pcb-connectors/board-to-board-connectors/spring-finger-contacts.html?tab=pgp-story.

CFE (www.cfconn.com); "Spring-Loaded Connectors"; Single row series → MF200-SS GG-A NN 100A; available before Jun. 28, 2017; 13 pages; https://www.aliexpress.com/item/electronical-components-supplier-china-pogo-pin-connector-factory-SMD-4pin-connector/32366492445.html.

SK Hynix; "SK hynix SSD Canvas SL301 2.5-Inch 500 GB Internal Solid State Drive"; product first made available Oct. 2, 2015; 10 pages; https://www.amazon.co.uk/SK-hynix-Canvas-2-5-Inch-Internal/dp/B0166S4CF8.

"Battery Contact Spring/AA Battery Spring Contact"; 7 pages; available before Jun. 28, 2017; https://www.aliexpress.com/item/Battery-Contact-Spring-AA-Battery-Spring-Contact/32493202439.html.

* cited by examiner

ELECTROSTATIC CHARGE BUILD-UP PREVENTION FOR DATA STORAGE DEVICES

BACKGROUND

The problem of electrostatic discharge (ESD) is well known. Static electric charges can build up on a person especially in winter when there is less air moisture to facilitate relatively easy movement of electrons from the person's body into the surrounding air. This electrostatic charge leads to problems, for example, when the person works with sensitive electronic equipment, for example maintaining and using data storage devices such as solid state drives.

SUMMARY

Embodiments of the present disclosure are generally directed to providing a low impedance path from a casing/housing of an electronic device to an internal ground of the device. When an electrostatically-charged person touches the electronic device having the low impedance path, a controlled discharge of electrical current from the person through the low impedance path takes place without the person suffering a shock or the device being damaged. Also, the low impedance path prevents a build-up of electrostatic charge on a user of the device.

In one embodiment, a data storage drive is provided. The data storage drive includes a memory and a controller which is communicatively coupled to the memory. A casing encloses the controller and the memory. At least one electrically conductive grounding pad is included on an exterior of the casing. The electrically conductive grounding pad forms a portion of a low impedance path that extends from the grounding pad to a system ground in an interior of the data storage drive. The low impedance path prevents a build-up of static electricity.

This Summary is not intended to describe each disclosed embodiment or every implementation of electrostatic charge build-up prevention. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Embodiments of the disclosure are generally directed to providing a low impedance path from a casing/housing of an electronic device to an internal ground of the device. However, prior to providing additional details regarding the different embodiments, a description of an illustrative operating environment is provided below.

Figure 1:
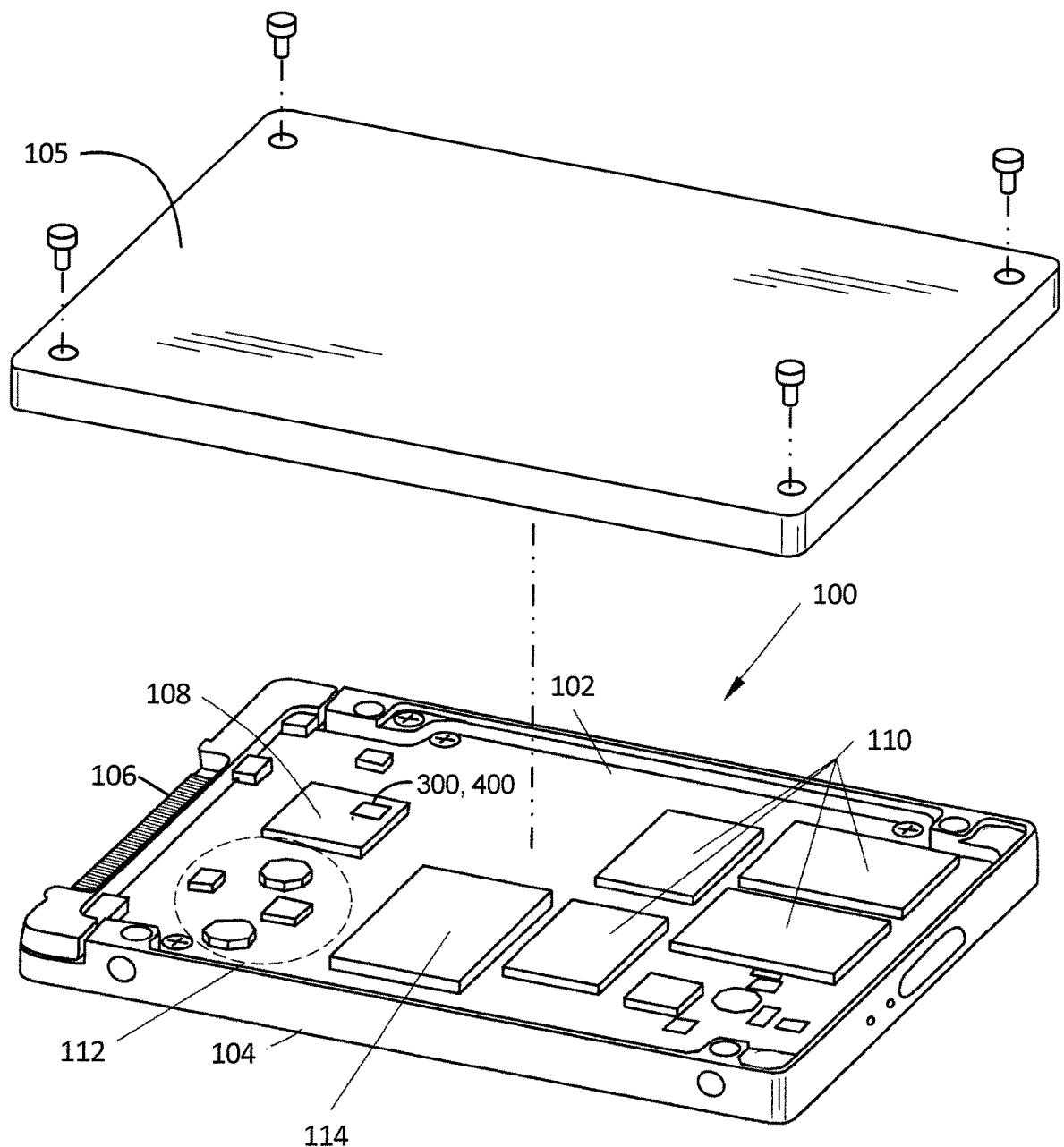
FIG. 1 is an exploded view of a solid-state drive in which different embodiments are useful.

FIG. 1 shows an illustrative operating environment in which a low impedance path as disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 illustrates an exploded view of a solid state drive (SSD) 100 in which a low impedance path for electrostatic charge build-up prevention is useful. SSD 100 includes one or more printed circuit boards (PCBs) or circuit card assemblies 102 and typically includes a protective, supportive housing 104, a top cover 105, and one or more interface connectors 106. SSD 100 further includes a controller ASIC 108, one or more non-volatile memory devices 110, and power regulation circuitry 112. The memory devices 110 are essentially the SSD's data storage media. SSD 100 may include erasure blocks as the physical storage locations within memory device 110, which may include Flash memory devices, for example. In some applications, SSD 100 further includes a power-backup energy storage device, such as a super-capacitor 114.

In accordance with certain aspects, the SSD 100 includes the circuit card assembly 102 that includes a connector 106 for connection to a host computer (not shown). In accordance with certain aspects, the connector 106 includes a NVMe (non-volatile memory express), SCSI (small computer system interface), SAS (serial attached SCSI), FC-AL (fiber channel arbitrated loop), PCI-E (peripheral component interconnect express), IDE (integrated drive electronics), AT (advanced technology), ATA (advanced technology attachment), SATA (serial advanced technology attachment), IEEE (institute of electrical and electronics engineers)-1394, USB (universal serial bus) or other interface connector adapted for connection to a host computer.

In SSD 100, top cover 105 and supportive housing 104, which are together referred to as a casing, may be formed of an electrically conductive material such as an electrically conductive metal or a non-conductive material such as plastic. In accordance with embodiments of the disclosure, whether the casing is electrically conductive or non-conductive, a low impedance path (not shown in FIG. 1) may be provided to a system ground (not shown in FIG. 1) of SSD 100. As indicated above, when an individual touches such an SSD, a build-up of electrostatic charge on the individual's body is prevented by the low impedance path from the casing of the SSD to a system ground of the SSD. Examples of low impedance paths in accordance with different embodiments are provided below in connection with FIGS. 2-5.

Figure 2:
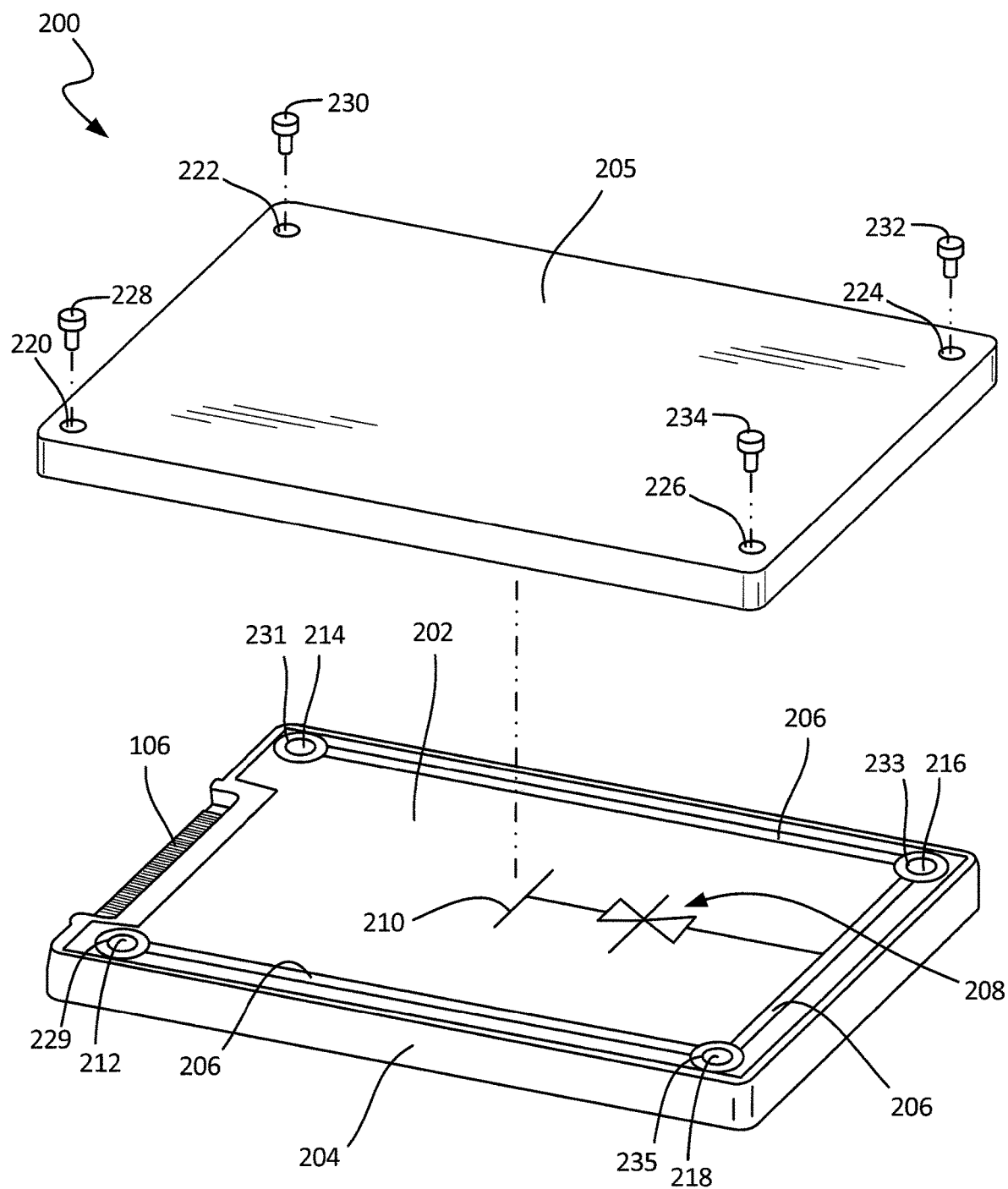
FIG. 2 is an exploded view of a data storage drive in accordance with a first embodiment.

FIG. 2 is a diagrammatic illustration of an electronic device 200 that includes a low impedance path in accordance with a first embodiment. Electronic device 200 may be an SSD such as 100 or any device that has one or more electronic components within a casing. In the interest of simplification, electronic/electrical components that do not form a part of the low impedance path are not shown in FIG. 2. As can be seen in FIG. 2, device 200 includes a PCB 202, a supportive housing 204, a cover 205 and a low impedance path that includes multiple components. In the example embodiment of FIG. 2, cover 205 is substantially entirely formed of an electrically conductive material (e.g., aluminum), and therefore the cover 205 forms a portion of the low impedance path. The low impedance path further includes an electrically conductive trace 206 that may run along, or be positioned proximate to, a periphery or perimeter of PCB 202. In the embodiment of FIG. 2, PCB 202 is substantially rectangular in shape and trace 206 includes three portions that are coupled together (e.g., electrically shorted). However, in different embodiments, PCB 202 and/or trace 206 may have any suitable shape and are not limited to the shape shown in FIG. 2. An ESD suppression diode (e.g., a transient voltage suppressor diode) 208 is connected to trace 206 and to system ground 210.

As shown in FIG. 2, supportive housing 204 includes grooves 212, 214, 216 and 218 that are located at corners of the supportive housing 204. Cover 205 includes corner holes 220, 222, 224 and 226, which are coaxially aligned with housing grooves 212, 214, 216 and 218 when cover 205 is properly positioned on supportive housing 204. Each of grooves 212, 214, 216 and 218 is configured to receive a fastener 228, 230, 232, 234. Grooves 212, 214, 216 and 218 may include threads if, for example, fasteners 228, 230, 232 and 234 are screws.

Cover 205 is secured to supportive housing 204 by properly positioning cover 205 on supportive housing 204 and then inserting respective ones of fasteners 228, 230, 232 and 234 into corner holes 220, 222, 224 and 226 and corresponding housing grooves 212, 214, 216 and 218, respectively. Fasteners 228, 230, 232 and 234 may then be tightened to hold the assembly in place.

As indicated above, each of fasteners 228, 230, 232 and 234 is formed of an electrically conductive material. When the assembly is complete, each of fasteners 228, 230, 232 and 234 is in contact with electrically conductive cover 205 and in contact with electrically conductive trace 206 via electrically conductive mounting hole pads 229, 231, 233 and 235 in the PCB 202. Thus, in some embodiments of the assembled device 200, the low impedance path includes the cover 205, the fasteners 228, 230, 232 and 234, the mounting hole pads 229, 231, 233 and 235, the trace 206, the ESD protection diode 208 and system ground connection 210. As indicated above, when an individual touches assembled device 200, a build-up of electrostatic charge on the individual's body is prevented by the low impedance path from the cover 205 to the system ground 210.

Figure 3:
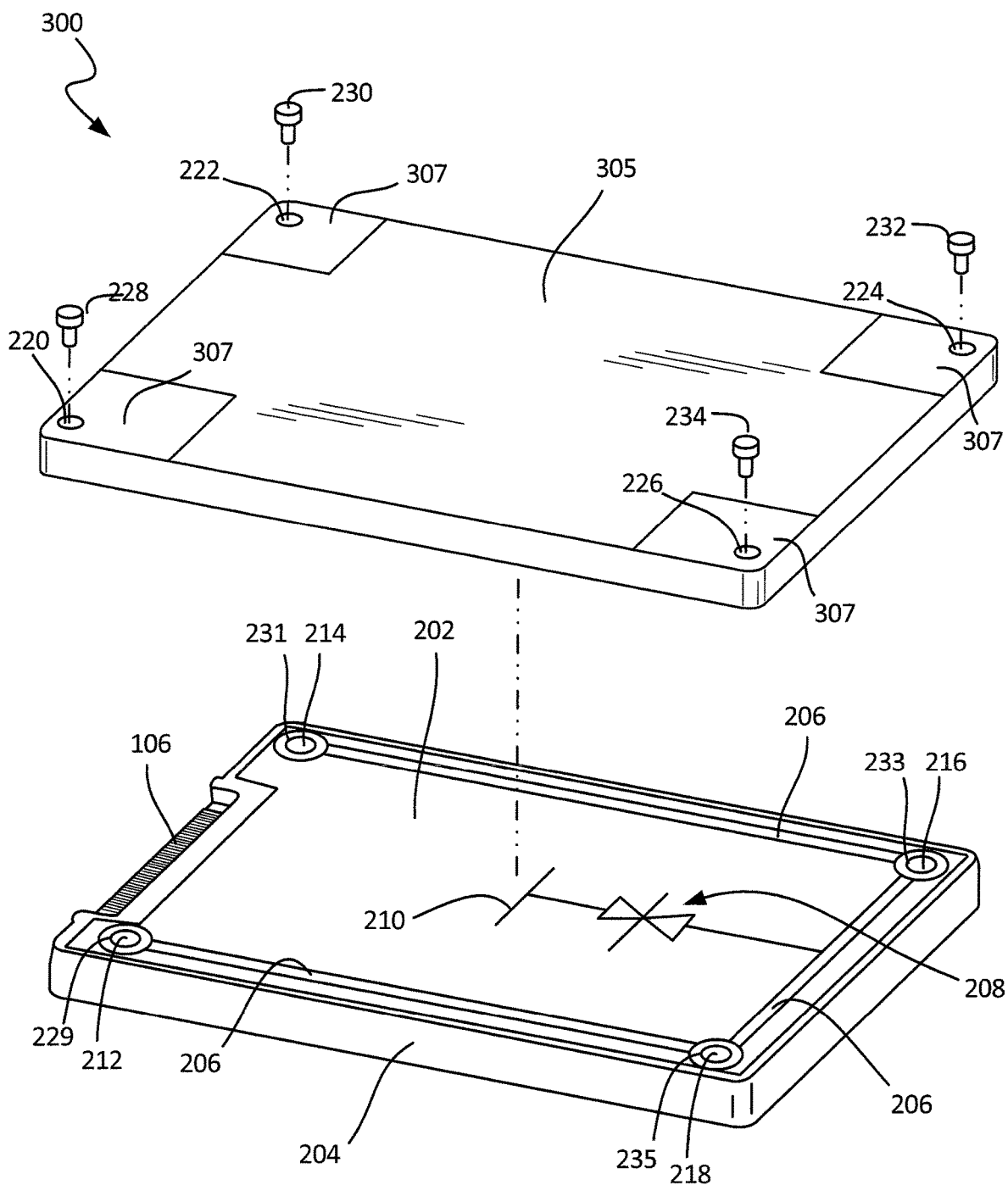
FIG. 3 is an exploded view of a data storage drive in accordance with a second embodiment.

FIG. 3 is a diagrammatic illustration of an electronic device 300 that includes a low impedance path in accordance with a second embodiment. Several elements included in earlier-described FIG. 2 are also included in FIG. 3. Therefore, in the interest of brevity, a description of those elements is not repeated in connection with FIG. 3. Electronic device 300 of FIG. 3 differs from electronic device 200 of FIG. 2 in that it includes a cover 305 that is formed of a non-electrically conductive material (e.g., a plastic). Therefore, electrically conductive grounding pads 307 are included at least at corners of cover 305. The grounding pads 307 may include any suitable electrically conductive coating on the cover 305. In some embodiments, the grounding pads 307 are included only on an exterior of cover 305. In other embodiments, the grounding pads are applied on the exterior and an interior portion of the cover 305.

Accordingly, in some embodiments, the low impedance path includes the grounding pads 307 on the exterior of the cover 305, the fasteners 228, 230, 232 and 234, the mounting hole pads 229, 231, 233 and 235, the trace 206, the ESD protection diode 208 and system ground connection 210. When an individual touches a grounding pad of assembled device 300, a build-up of electrostatic charge on the individual's body is prevented by the low impedance path from the cover 305 to the system ground 210.

Figure 4:
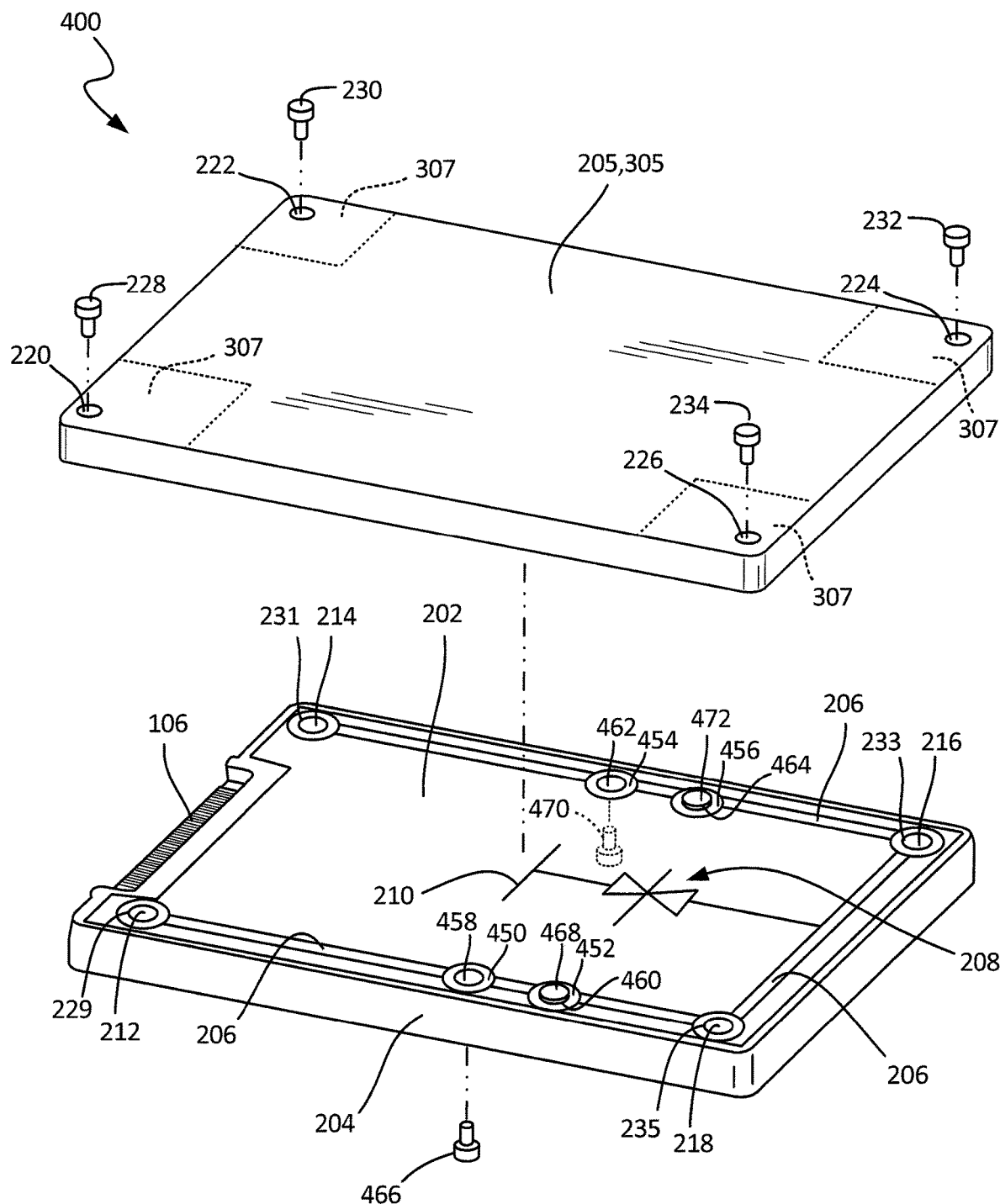
FIG. 4 is an exploded view of a data storage drive in accordance with a third embodiment.

FIG. 4 is a diagrammatic illustration of an electronic device 400 that includes a low impedance path in accordance with a third embodiment. Several elements included in earlier-described FIGS. 2 and 3 are also included in FIG. 4. Therefore, in the interest of brevity, a description of those elements is not repeated in connection with FIG. 4. Electronic device 400 of FIG. 4 differs from electronic devices 200 and 300 (of FIGS. 2 and 3) in that it includes additional electrically conductive mounting hole pads 450, 452, 454 and 456 in PCB 202, additional grooves 458, 460, 462 and 464 in supportive housing 204 and additional fasteners 466, 468, 470 and 472. It should be noted that the cover 205, 305 and/or supportive housing 204 may be formed of either electrically conductive or non-electrically conductive materials. When cover 205 that is formed of an electrically conductive material is employed, grounding pads 307 may be excluded. However, as described earlier in connection with FIG. 3, electrically conductive grounding pads 307 are employed when cover 305, which is formed of a non-electrically conductive material, is used. In the embodiment of FIG. 4, in addition to including elements described above in connection with FIGS. 2 and 3, the low impedance path may include the additional electrically conductive mounting hole pads 450, 452, 454 and 456 in PCB 202 and the additional fasteners 466, 468, 470 and 472. It should be noted that, in different embodiments, any suitable number of mounting hole pads, fasteners, etc., may be employed.

Figure 5A:
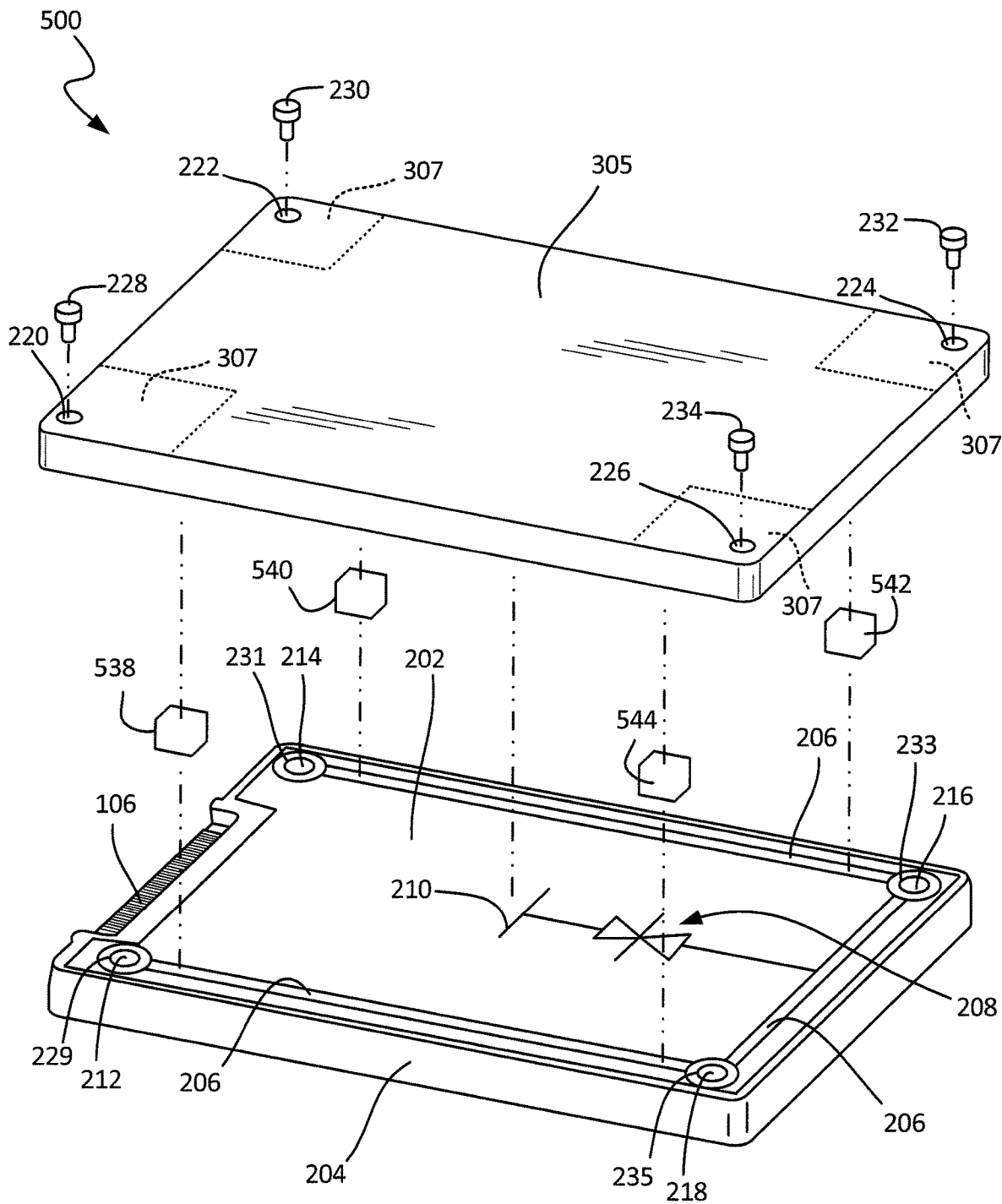
FIG. 5A is an exploded view of a data storage drive in accordance with a fourth embodiment.

FIG. 5A is a diagrammatic illustration of an electronic device 500 that includes a low impedance path in accordance with a fourth embodiment. Several elements included in earlier-described FIGS. 2, 3 and 4 are also included in FIG. 5A. Therefore, in the interest of brevity, a description of those elements is not repeated in connection with FIG. 5A. Electronic device 500 of FIG. 5A differs from electronic devices 200, 300 and 400 (of FIGS. 2, 3 and 4) in that it additionally includes electrical connectors 538, 540, 542 and 544 that may be coupled to interior corners of cover 205, 305 to provide an electrical connection between cover 205, 305 and trace 206 when cover 205, 305 is secured to supportive housing 204. In such embodiments, fasteners 228, 230, 232 and 234 may or may not be electrically conductive and therefore may or may not be electrically coupled to trace 206. As noted above, when cover 205 that is formed of an electrically conductive material is employed, grounding pads 307 may be excluded. However, as described earlier, electrically conductive grounding pads 307 are employed when cover 305, which is formed of a non-electrically conductive material, is used. In should be noted that, in such embodiments, grounding pads 307 also cover portions of the interior of cover 305 so the electrical path is via the external portions of the grounding pads 307 to the interior portions of the grounding pads 307, which are electrically coupled by the connectors 538, 540, 542 and 544 that are in contact with the trace 206 when the cover 305 is secured to the supportive housing 204.

Figure 5B:
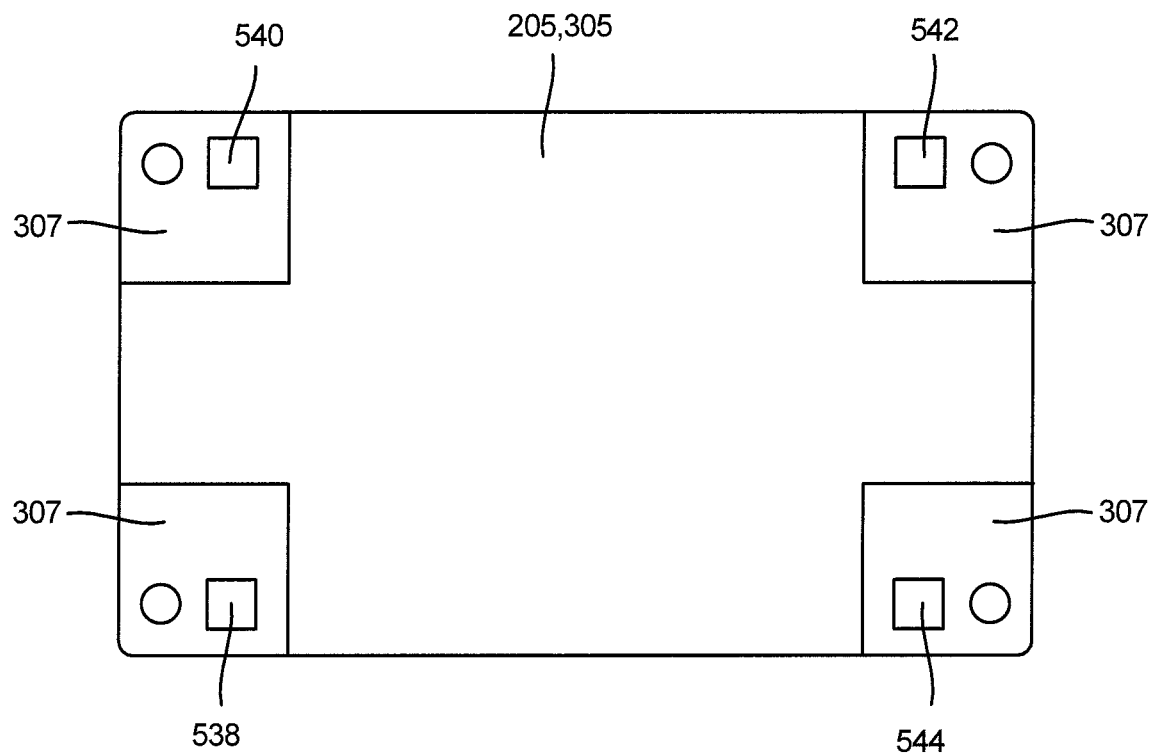
FIGS. 5B and 5C are diagrammatic illustrations of portions of the data storage drive of FIG. 5A.
Figure 5C:
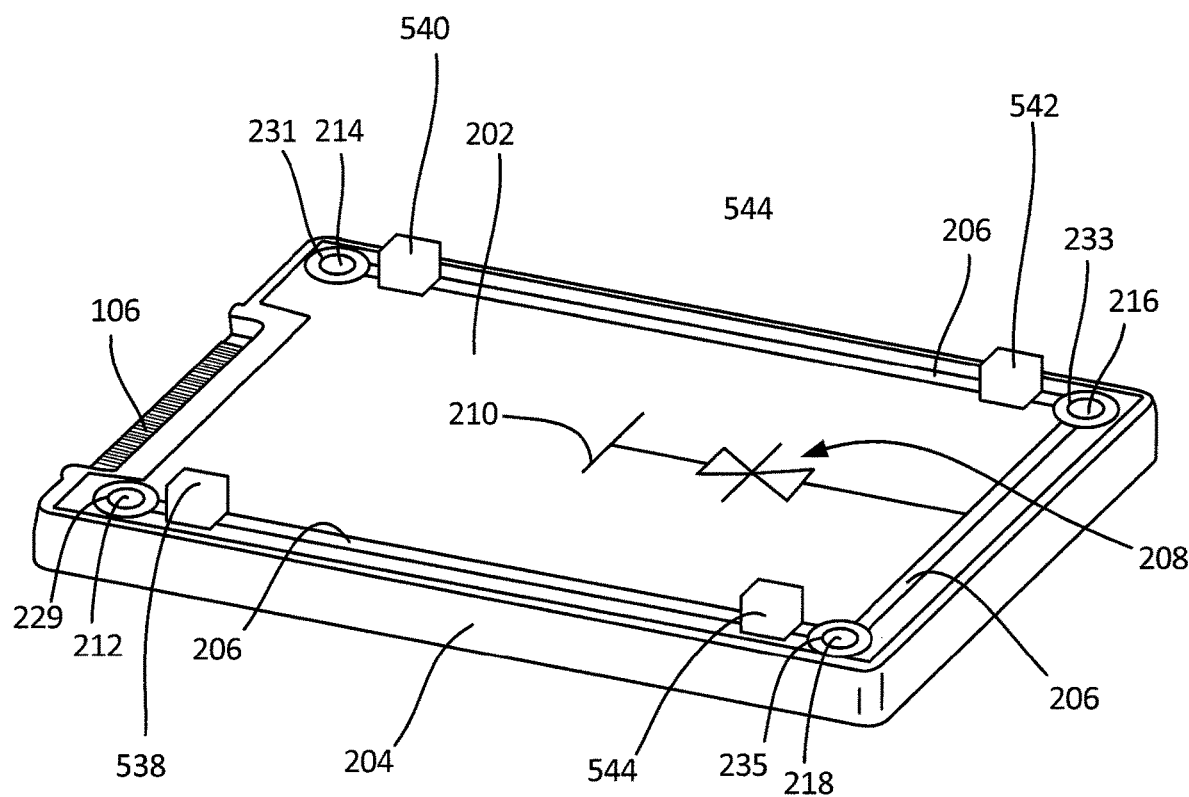

FIG. 5B illustrates an interior or inside of cover 205, 305 showing that connectors 538, 540, 542 and 544 may be coupled to interior corners of cover 205, 305 to provide an electrical connection between cover 205 and trace 206 when cover 205, 305 is secured to supportive housing 204. FIG. 5C is an alternate embodiment showing that connectors 538, 540, 542 and 544 may be coupled to trace 206 to provide an electrical connection between cover 205, 305 and trace 206 when cover 205, 305 is secured to supportive housing 204.

Figure 5D:
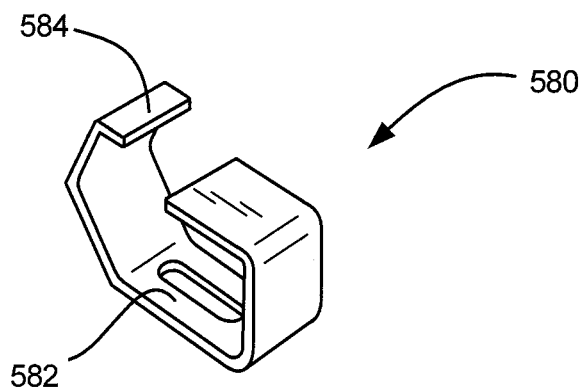
FIGS. 5D and 5E are diagrammatic illustrations of example electrical connectors that may be employed in the data storage drive of FIG. 5A.
Figure 5E:
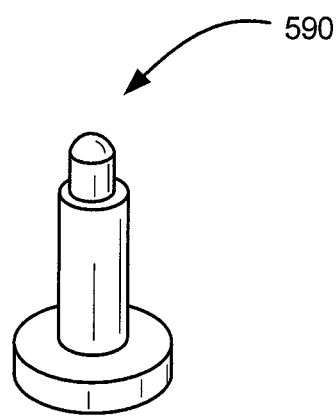

FIG. 5D is a diagrammatic illustration showing an example spring connector 580 that may be employed as the electrical connector 538, 540, 542, 544. A bottom portion 582 of the spring connector 580 may be secured to cover 205, 305 (in accordance with the embodiment of FIG. 5B) or to PCB 202 on trace 206 (in accordance with the embodiment of FIG. 5C). As indicated above, electrical connection between cover 205, 305 and trace 206 is provided via spring connector 580 when cover 205, 305 is secured to supportive housing 204. When cover 205, 305 is secured to supportive housing 204, a top portion 584 of the spring connector 580 is in contact with trace 206 (in accordance with the embodiment of FIG. 5B) or in contact with cover 205, 305 (in accordance with the embodiment of FIG. 5C). FIG. 5E is a diagrammatic illustration showing an example pin connector 590 that may be employed as the electrical connector 538, 540, 542, 544. As noted above in connection with FIG. 5D, one portion of the spring connector 590 is secured to the cover 205, 305 (in accordance with the embodiment of FIG. 5B) or to PCB 202 on trace 206 (in accordance with the embodiment of FIG. 5C). A suitable electrical connection is provided when the cover 205, 305 is secured to supportive housing 204.

Figure 6A:
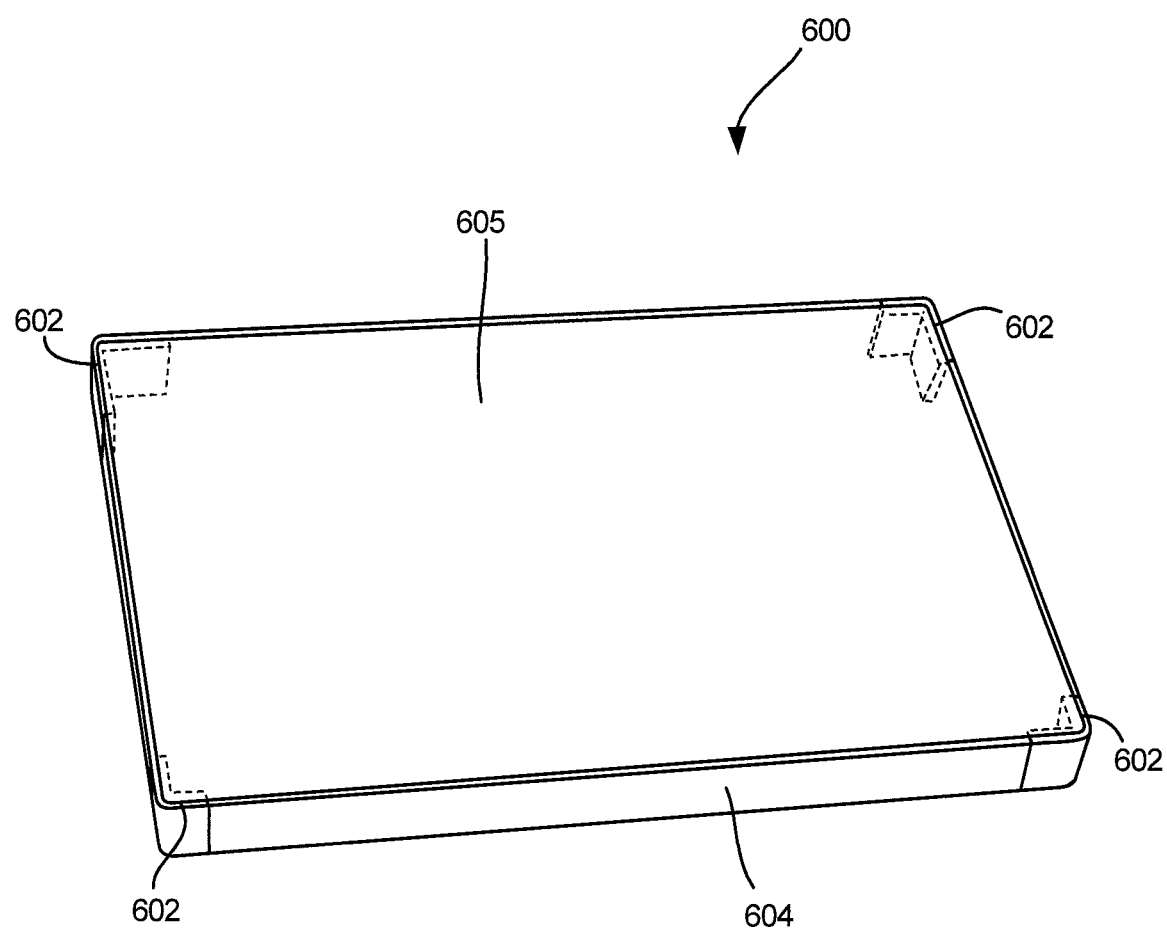
FIGS. 6A and 6B are diagrammatic illustrations of a data storage drive in accordance with a with s fifth embodiment.
Figure 6B:
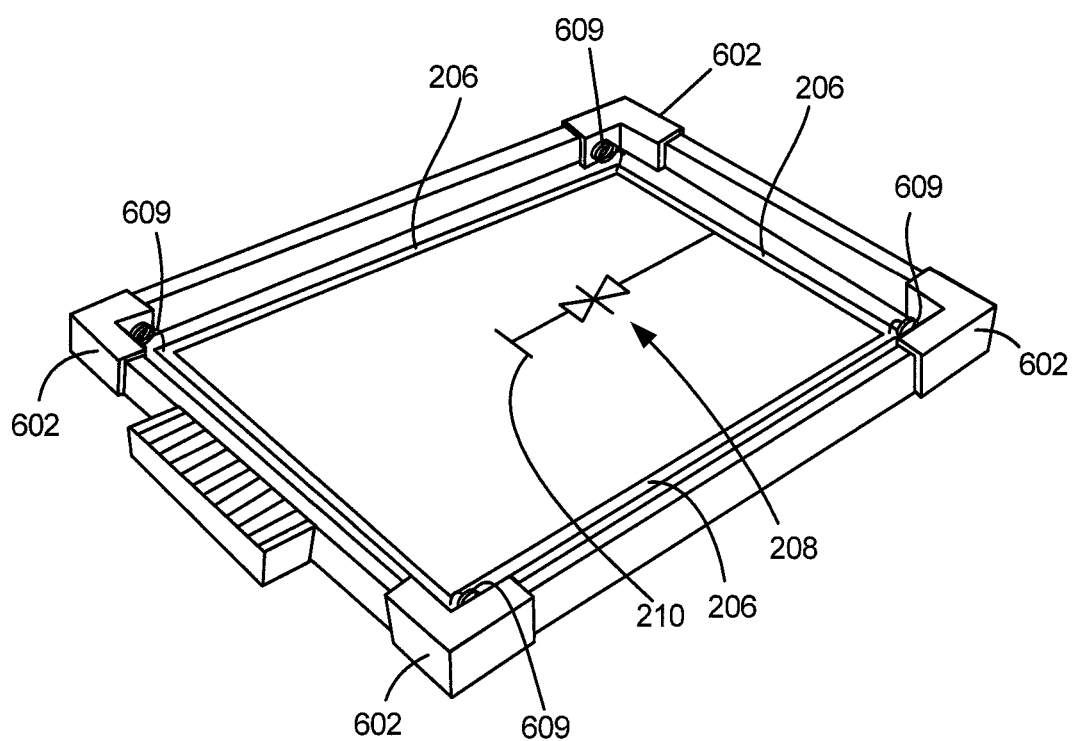

FIG. 6A is a diagrammatic illustration of an electronic device 600 that includes a low impedance path in accordance with a fifth embodiment. In the embodiment of FIG. 6A, an electrically conductive tape 602 is interlaced/pasted such that it is exposed outside the casing and extends inside the casing as well. In the example embodiment shown in FIG. 6A, the conductive tape 604, which forms a portion of the low impedance path, is attached to the casing (cover 605 and/or supportive housing 604). The internal components that form the remaining portion of the low impedance path are shown in FIG. 6B. As can be seen in FIG. 6B, interior corners of the device 600 include electrical connectors (e.g., coil springs) 609 that electrically connect the conductive tape 602 to the trace 206.

It should be noted that, although the above-described embodiments show the trace positioned along the periphery of PCB and the electrically conductive fasteners positioned at corners of the electronic device, any suitable number of fasteners, and any suitable location for the fastener(s) (or connector(s)) and trace may be used in different embodiments.

Figure 7:
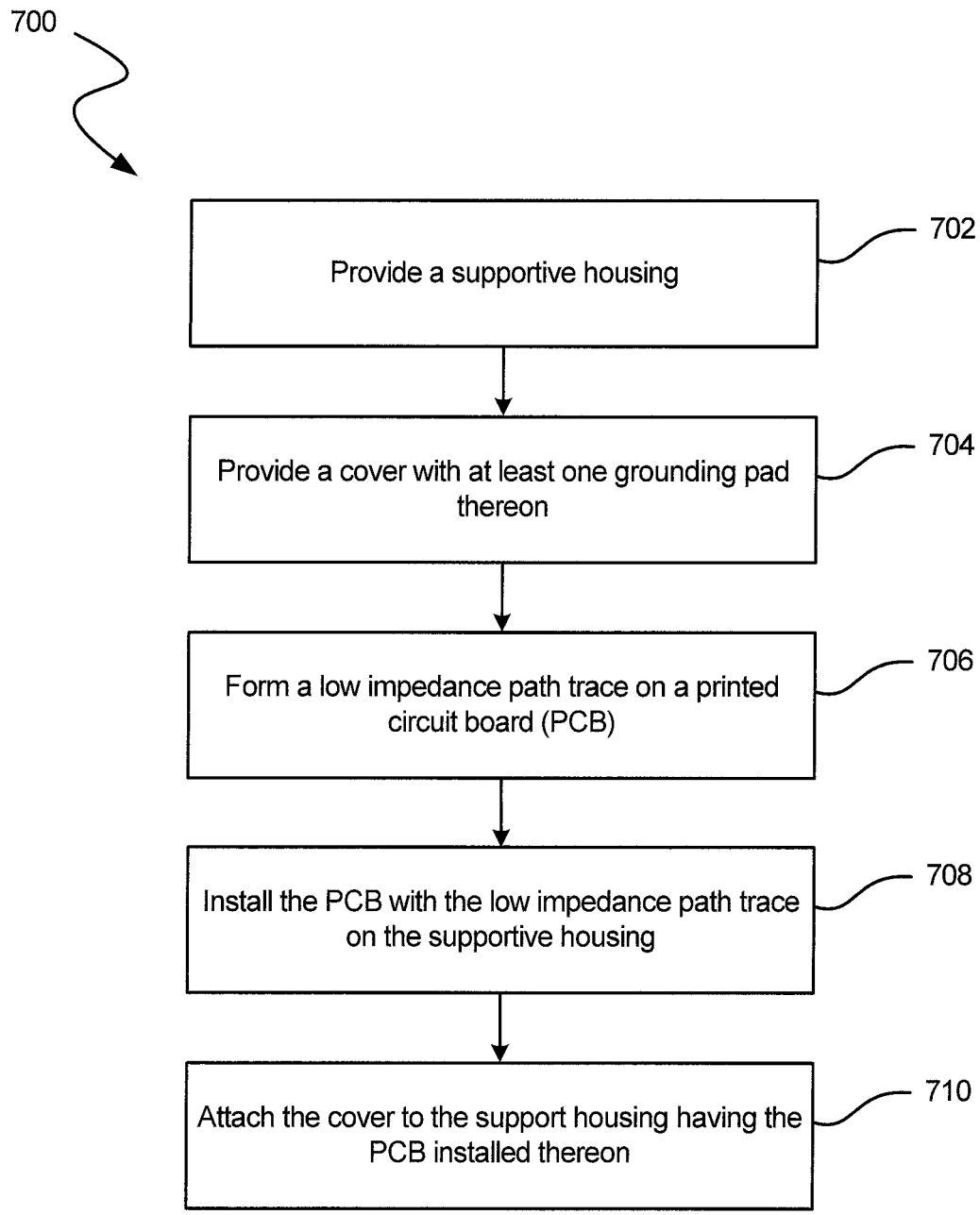
FIG. 7 is a flow diagram of a method embodiment.

FIG. 7 is a flow diagram 700 of a method embodiment. At step 702, a supportive housing is provided. As step 704, a cover with at least one grounding pad thereon is provided. At step 706, a low impedance path trace is formed on a printed circuit board (PCB). At step 708, the PCB with the low impedance path trace is installed on the supportive housing. At step 710, the cover is attached to the support housing having the PCB installed thereon. When the cover is attached to the supportive housing, at least one fastener that couples the cover to the supportive is electrically connected to both the grounding pad and the low impedance path trace.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage drive comprising:
a non-volatile memory;
a controller communicatively coupled to the non-volatile memory;
a casing that encloses the controller and the non-volatile memory; and
at least one electrically conductive grounding pad on an exterior of the casing, wherein the at least one electrically conductive grounding pad forms a portion of a low impedance path, and
wherein the low impedance path extends from the at least one grounding pad on the exterior of the casing to a system ground in an interior of the data storage drive, and wherein the low impedance path is configured to prevent a build-up of static electricity.

2. The data storage drive of claim 1 and further comprising at least one electrically conductive fastener that is electrically coupled to the at least one grounding pad and electrically coupled to the system ground of the data storage drive, and wherein the at least one electrically conductive fastener forms a portion of the low impedance path.

3. The data storage drive of claim 2 and further comprising a printed circuit board (PCB) and a low impedance path trace disposed on the PCB, wherein the controller, the non-volatile memory and an electrostatic discharge (ESD) diode are mounted on the PCB, and wherein the ESD diode is electrically coupled to the low impedance path trace and the system ground, and wherein the at least one electrically conductive fastener is electrically coupled to the low impedance path trace via electrically conductive mounting hole pads.

4. The data storage drive of claim 3 and wherein the casing comprises a cover having four corners, and wherein the at last one grounding pad comprises four grounding pads, and wherein each different one of the four grounding pads is positioned at a different one of the four corners of the cover.

5. The data storage drive of claim 4 and wherein the at least one electrically conductive fastener comprises four electrically conductive fasteners.

6. The data storage drive of claim 5 and wherein each different one the four different electrically conductive fasteners is coupled to a different one of the four grounding pads.

7. The data storage drive of claim 6 and wherein the low impedance path trace is positioned substantially along a periphery of the PCB, and wherein the low impedance path trace is coupled to the electrically conductive mounting hole pads, and wherein each different one of the four electrically conductive fasteners is coupled to a different one of the electrically conductive mounting hole pads.

8. The data storage drive of claim 7 and wherein each one of the four different fasteners is releasably mechanically coupled the casing.

9. The data storage drive of claim 1 and wherein the at least one grounding pad comprises an electrically conductive metallic coating on at least one of an exterior or an interior of the casing.

10. The data storage drive of claim 1 and further comprising at least one electrical connector directly coupled to the at least one grounding pad and electrically coupled to the system ground of the data storage drive, and wherein the at least one electrical connector forms a portion of the low impedance path.

11. The data storage drive of claim 10 and wherein the data storage drive comprises a solid state drive.

12. An electronic device comprising:
a casing, wherein at least a portion of the casing is electrically conductive;
a printed circuit board (PCB) within the casing; and
a low impedance path trace on the PCB, wherein the low impedance path trace is electrically coupled to the electrically conductive portion of the casing and direct electrically direct coupled to a system ground in an interior of the electronic device.

13. The electronic device of claim 12 and wherein the casing comprises a cover that is formed of an electrically conductive material, and wherein the cover forms the electrically conductive portion of the casing.

14. The electronic device of claim 12 and wherein the casing comprises a cover that is formed of a non-electrically conductive material, and wherein the casing comprises at least one grounding pad on the cover, and wherein the at least one grounding pad forms the electrically conductive portion of the casing.

15. The electronic device of claim 13 and further comprising at least one electrically conductive fastener that is electrically coupled to the cover and electrically coupled to the system ground of the electronic device via the low impedance path trace.

16. The electronic device of claim 12 and wherein the low impedance path trace is positioned substantially along a periphery of the PCB.

17. The electronic device of claim 16 and further comprising and electrostatic discharge (ESD) diode mounted on the PCB, and wherein the ESD diode is electrically coupled to the low impedance path trace and the system ground.

18. A method comprising:
providing a supportive housing;
providing a cover with at least one grounding pad thereon;
forming a low impedance path trace on a printed circuit board (PCB);
installing the PCB with the low impedance path trace on the supportive housing; and
attaching the cover to the support housing having the PCB installed thereon,
when the cover is attached to the supportive housing, at least one fastener that couples the cover to the supportive is electrically connected to both the grounding pad and the low impedance path trace.

19. The method of claim 18 and wherein the low impedance path trace along a periphery of the PCB.

20. The method of claim 19 and wherein the at least one fastener is in direct contact with a mounting hole pad to which the trace is directly connected.

* * * * *